(12) United States Patent
Kim et al.

(10) Patent No.: US 7,297,463 B2
(45) Date of Patent: Nov. 20, 2007

(54) PHOTOSENSITIVE POLYMER AND CHEMICALLY AMPLIFIED PHOTORESIST COMPOSITION INCLUDING THE SAME

(75) Inventors: Deog-Bae Kim, Kyungki-Do (KR); Sang-Jeoung Kim, Kyungki-Do (KR); Hwa-Young Kim, Kyungki-Do (KR); Jin Jegal, Kyungki-Do (KR); Jae-Hyun Kim, Kyungki-Do (KR)

(73) Assignee: Dongjin Semichem Co., Ltd., Incheon (KR)

( * ) Notice: Subject to any disclaimer, the term of this patent is extended or adjusted under 35 U.S.C. 154(b) by 372 days.

(21) Appl. No.: 11/142,444

(22) Filed: Jun. 2, 2005

(65) Prior Publication Data

US 2005/0271977 A1    Dec. 8, 2005

(30) Foreign Application Priority Data

Jun. 3, 2004    (KR) .................. 10-2004-0040540

(51) Int. Cl.
  *C08F 212/08*    (2006.01)
(52) U.S. Cl. .................. 430/270.1; 524/555; 526/310; 526/314; 526/332; 526/347
(58) Field of Classification Search ............ 430/270.1; 524/555; 526/310, 314, 332, 347
  See application file for complete search history.

(56) References Cited

U.S. PATENT DOCUMENTS 6,743,881 B2 *  6/2004  Kim et al. .................. 526/347
2004/0072097 A1 *  4/2004  Kodama .................. 430/270.1

* cited by examiner

*Primary Examiner*—Alexa D. Neckel
*Assistant Examiner*—Anca Eoff
(74) *Attorney, Agent, or Firm*—Birch, Stewart, Kolasch & Birch, LLP

(57) ABSTRACT

A photosensitive polymer for forming high-resolution fine circuit patterns with an exposure light source of a short wavelength, and a chemically amplified photoresist composition including the polymer, are disclosed. The photosensitive polymer is represented by the following Formula 1,

[Formula 1]

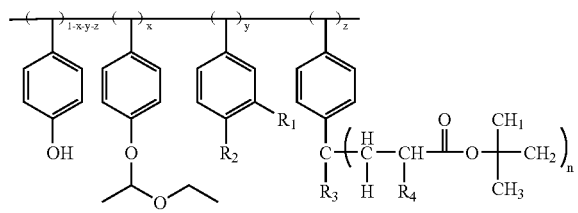

wherein $R_1$ is a hydrogen atom, $R_2$ is a hydrogen atom,

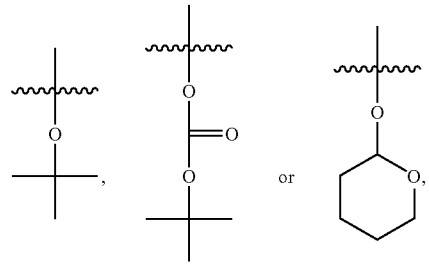

$R_3$ is a chlorine atom, a bromine atom, hydroxy, cyano, t-butoxy, $CH_2NH_2$, $CONH_2$, $CH=NH$, $CH(OH)NH_2$ or $C(OH)=NH$ group, $R_4$ is a hydrogen atom or methyl group, each of 1-x-y-z, x, y and z is a degree of polymerization of each repeating unit constituting the photosensitive polymer, x, y and z are 0.01 to 0.8, respectively, and n is 1 or 2.

7 Claims, No Drawings

PHOTOSENSITIVE POLYMER AND CHEMICALLY AMPLIFIED PHOTORESIST COMPOSITION INCLUDING THE SAME

FIELD OF THE INVENTION

This invention relates to a photosensitive polymer and a chemically amplified photoresist composition including the same. More specifically, this invention relates to a photosensitive polymer for forming high-resolution fine circuit patterns by using a deep UV exposure light source of a short wavelength, and a chemically amplified photoresist composition including the same.

BACKGROUNDS OF THE INVENTION

As the degree of integration of a semiconductor integrated circuit has increased 4-fold for 3 years, a dynamic random access memory (hereinafter "DRAM") having the memory capacity of more than one gigabit has been developed. To produce such a large capacity DRAM, there is a need for the development of a photosensitive polymer and a photoresist composition capable of forming a fine photoresist pattern whose line width is of 0.18 μm.

Generally, the photolithography process for the semiconductor manufacturing process includes the steps of a) uniformly coating a photoresist composition containing a photosensitive polymer and a solvent on a semiconductor substrate, b) soft-baking the coated photoresist composition to drive off the solvent, thereby forming a resist film on the substrate, c) exposing to an exposure light source, a photo-mask(reticle) and the substrate on which the resist film is formed, thereby repeatedly projecting the reduced-image of the photo-mask to the resist film; d) selectively removing the exposed resist film using a developer; e) hard-baking the developed resist film for rigid sticking of the film to the substrate; f) etching the substrate according to the hard-baked resist film pattern; and g) stripping the unnecessary resist film after the etching step.

The photoresist composition for the photolithography process must have properties such as a high resolution, a good optical sensitivity and a good transparency with respect to the exposure light, and also must have properties such as a good contrast, a fast photo-speed, a good thermal stability, adhesiveness and etch resistance. The photosensitivity represents the degree of reaction of the photoresist composition in response to the exposure light. If the photosensitivity is fine, the amount of the photoresist composition reacting with the exposure light per unit hour is increased and then the productivity can be enhanced. In order to increase the photosensitivity, there is introduced a chemically amplified photoresist composition containing a photosensitive polymer and a photo-acid generator. If the chemically amplified photoresist composition is exposed to the light, the photo-acid is generated from the photo-acid generator to form a latent image in the photoresist composition. The generated photo-acid is activated at the heating process after the exposure, to cause a) a cross-linking reaction of the photosensitive polymer contained in the photoresist composition or b) a depolymerization or deprotection of the main chain or a functional group substituted to the main chain of the photosensitive polymer. In turn, the photo-acid can be generated as a by-product of the above-mentioned cross-linking reaction, depolymerization or deprotection, and then a chain reaction therefrom occurs to enhance the photosensitivity of the photoresist composition. The resolution is defined as a minimum size of the fine circuit pattern that can be formed by the photoresist under the most suitable process condition, and is an important index for evaluating the photoresist. The resolution(R) is mathematically defined by ($\kappa\lambda/NA$), wherein $\kappa$ is a parameter dependent on the process condition and an inherent physical property of the photoresist, $\lambda$ is a wavelength (nm) of the exposure light and NA is a numeral aperture of the lens. As shown in the above expression, the high resolution can be accomplished by using a light source of a shorter wavelength or the photosensitive polymer and the photoresist composition having a low parameter ($\kappa$), at the exposure process.

Historically, early in the 1980s, the G-line (436 nm) exposure process had been introduced using a high-pressure mercury lamp to form a circuit pattern having a resolution of 1 μm and the I-line (365 nm) exposure process had been introduced to form a circuit pattern having a resolution of 0.5 μm or less. Thereafter the exposure technology using a shorter wavelength of 300 nm or less, for example KrF eximer laser using a light of 248 nm wavelength, had been developed to mass-produce 256M DRAM having the resolution of less than 0.5 μm. A step-and-repeat type aligner, which is usually called "a stepper" is used as an equipment for the exposure process. The stepper is used according to the exposure light source, for example, G-line(436 nm), I-line(365 nm), ArF(193 nm) eximer laser, KrF(298 nm) eximer laser and so on. The exposure equipment using X-ray or EUV (Extreme Ultra Violet) as the exposure light source is under the investigation and development.

As described above, the photoresist composition for the photolithography process using a light of a short wavelength as an exposure light source must have a good physical property such as the good transparency, good photosensitivity and high resolution. However, a conventional composition consisting of quinonediazide photo-activation compounds and phenol-novolak resin, which is used in the conventional G-line(436 nm) or I-line(365 nm) exposure process, absorbs the exposure light of 300 nm or less and has a low transparency. Also, the patterns formed by the conventional G-line(436 nm) or I-line(365 nm) exposure process are not stable, and the steep patterns cannot be formed. Therefore, there is a demand for a chemically amplified photoresist composition having an excellent physical property even in case of using the exposure light source of 300 nm or less.

Among the chemically amplified photoresist composition, the negative photoresist composition includes a binder resin that is soluble in an alkali aqueous solution, a cross-linking agent, a photo-acid generator and a solvent (Jour. Vacuum Science Technology., Vol. B6, 1988). The photo-acid generated from the photo-acid generator operates as a catalyst for activating the cross-linking agent so that the binder resin becomes insoluble and the negative circuit patterns are formed in the succeeding developing process. When the conventional photoresist composition including a novolak resin as the binder resin, a melamine cross-linking resin and the photo-acid generator is exposed to the KrF eximer laser of 248 nm or ArF eximer laser of 193 nm, the circuit pattern is inversely tapered by the light absorption of the novolak binder resin and the melamine cross-linking resin (Jour. Vacuum Science Technology., Vol. B7, 1988). Therefore, a research has been performed on a chemically amplified positive photoresist composition tp replace the chemically amplified negative photoresist composition (Pro. Spie., Vol 1262, p32, 1990). The chemically amplified positive photoresist composition contains a photosensitive polymer, a photo-acid generator and a solvent. The photo-acid generated from the photo-acid generator at an exposed part of the photoresist film acts as a catalyst which promotes a depolymerization or deprotection of the main chain or the protection group substituted to the main chain of the photosensitive polymer, so the positive patterns are formed in the succeeding developing process. As the chemically amplified positive photoresist composition, is usually used a resist material containing a polymer such as a polyvinylphenol derivatives which does not absorb the light of 300 nm or less wavelength. Specifically, exemplary chemically amplified positive photoresist composition includes a) the photoresist material comprising a poly(hydroxy styrene) blocked with tertiary-butoxy carbonyl(t-BOC) groups and an onium salt, provided by H. Ito et al. ("Polymers in Electronics", ACS Symposium Series, No. 242, American Chemical Society, Washington, D.C., 1984, p. 11), b) the photoresist material comprising poly(p-styreneoxytetrahydropyranyl) and the photo-acid generator, provided by Ueno et al. (36th Applied Physics Society Related Joint Meeting, 1989, 1p-k-7) and c) the three-component photoresist material consisting of a novolak resin, t-butoxycarbonyl protected bisphenol-A as dissolution inhibitor and pyrogallol methanesulfonic acid ester, provided by Schlegel et al. (37th Japanese Applied Physics Society announcement, 28p-ZE-4, 1990). The technology related to the preparation of the above-mentioned material is disclosed in Japanese Examined Patent Publication No. 1990-27660, Japanese Unexamined Patent Publication No. 1993-232706, Japanese Unexamined Patent Publication No. 1993-249683, U.S. Pat. Nos. 4,491,628 and 5,310,619 etc. The above-mentioned photoresist composition has a high resolution but a footing phenomenon in the patterns may occur due to the reaction with a substrate when there is a post exposure delay (PED) between exposure process and post-exposure-bake (PEB) process.

SUMMARY OF THE INVENTION

Therefore, it is an object of the present invention to provide a photosensitive polymer without a footing phenomenon even if there is a PED between an exposure process and a PEB process, and a chemically amplified photoresist composition including the same. It is other object of the present invention to provide a photosensitive polymer for forming a high-resolution fine circuit pattern with an exposure light source of a short wavelength, and a chemically amplified photoresist composition including the same.

To achieve these and other objects, the present invention provides a photosensitive polymer represented by the following Formula 1,

[Formula 1]

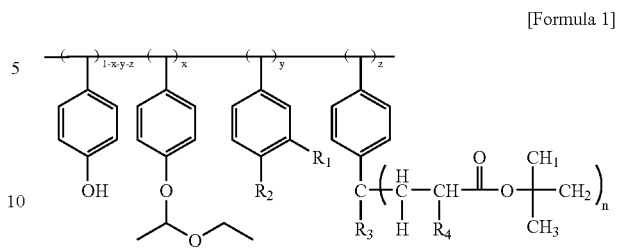

wherein $R_1$ is a hydrogen atom, $R_2$ is a hydrogen atom,

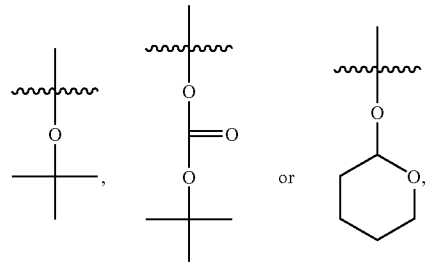

$R_3$ is a chlorine atom, a bromine atom, hydroxy, cyano, t-butoxy, $CH_2NH_2$, $CONH_2$, $CH=NH$, $CH(OH)NH_2$ or $C(OH)=NH$ group, $R_4$ is a hydrogen atom or methyl group, each of 1-x-y-z, x, y and z is a degree of polymerization of each repeating unit constituting the photosensitive polymer, x, y and z are 0.01 to 0.8, respectively, and n is 1 or 2. Also, the present invention provides a chemically amplified photoresist composition comprising the photosensitive polymer represented by the Formula 1, a photo-acid generator and an organic solvent.

DETAILED DESCRIPTION OF THE INVENTION

A more complete appreciation of the invention, and many of the attendant advantages thereof, will be better appreciated by reference to the following detailed description.

The photosensitive polymer according to the present invention is used to prepare a chemically amplified photoresist composition and is represented by the following Formula 1.

[Formula 1]

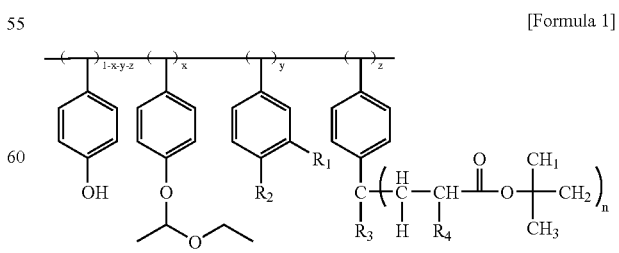

In formula 1, $R_1$ is a hydrogen atom, $R_2$ is a hydrogen atom,

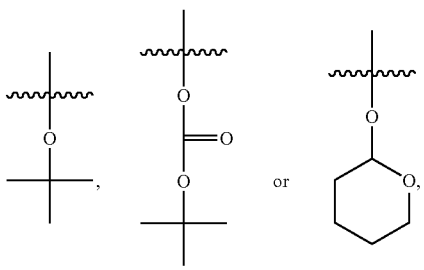

$R_3$ is a chlorine atom, a bromine atom, hydroxy, cyano, t-butoxy, $CH_2NH_2$, $CONH_2$, $CH=NH$, $CH(OH)NH_2$ or $C(OH)=NH$ group, $R_4$ is a hydrogen atom or methyl group, each of 1-x-y-z, x, y and z is a degree of polymerization of each repeating unit constituting the photosensitive polymer, x, y and z are 0.01 to 0.8, respectively, and n is 1 or 2.

The photosensitive polymer can be prepared by a polymerization of blocking group-substituted styrene monomers, preferably by ethylene polymerization, under an initiator such as azobisisobutyronitrile (AIBN) and an organic solvent such as tetrahydrofuran (THF). It is preferable that the photosensitive polymer prepared has weight average molecular weight of 3,000 to 30,000 and the polydispersity of 1.01 to 3.00. If the weight average molecular weight and the polydispersity thereof are beyond the above range, the physical property of the photoresist layer can be deteriorated, it is difficult to form the photoresist layer or a pattern contrast may be lowered.

Preferable examples of the photosensitive polymer according to the present invention can be represented by the following Formulas 1a to 1d.

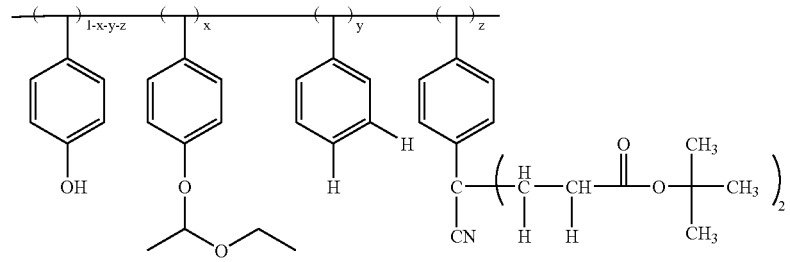

[Formula 1a]

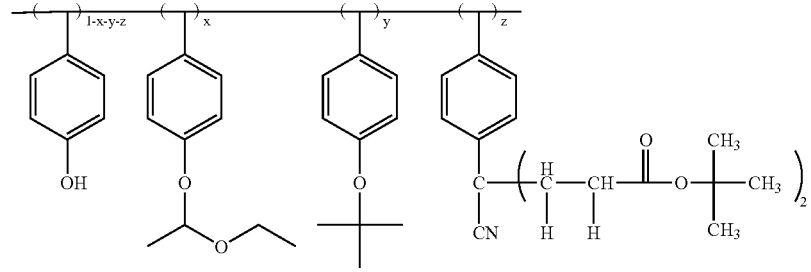

[Formula 1b]

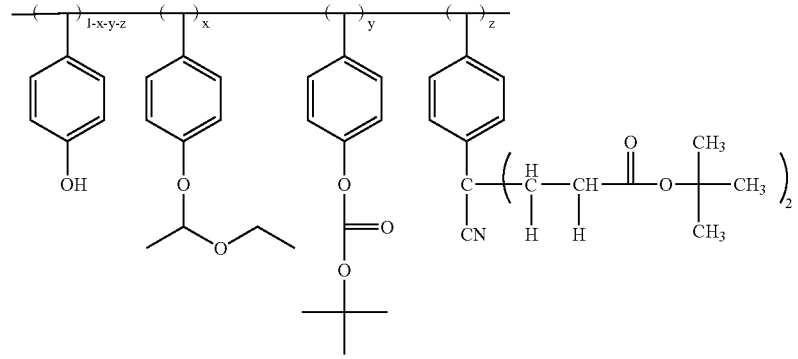

[Formula 1c]

-continued

[Formula 1d]

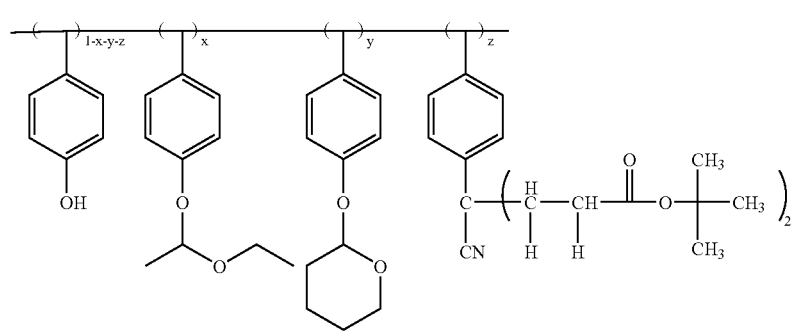

In Formulas 1a-1d, 1-x-y-z, x, y and z are a degree of polymerization of each repeating unit constituting the photosensitive polymer, and x, y and z are 0.01 to 0.8, respectively.

The photosensitive polymer represented by the Formula 1 enhances a dry etching resistance of the photoresist film. At an exposure process, the photosensitive polymer is deprotected by the photo-acid generated from the photo-acid generator, and the solubility thereof increases, while the non-exposed part of the film has an enough dissolution inhibitory ability. Accordingly the contrast and the resolution of the photoresist composition are increased and the fine circuit patterns can be formed even with the exposure light source of a short wavelength. Further, the footing phenomenon is not generated even if there is a PED between the exposure process and the PEB process.

The chemically amplified photoresist composition according to the present invention comprises a) the photosensitive polymer represented by the Formula 1, b) a photo-acid generator for producing the photo-acid and c) an organic solvent, and, if necessary, includes various additives. Preferably the amount of the photosensitive polymer is 0.1 to 50 weight % with respect to the total chemically amplified photoresist composition, and more preferably the amount of the photosensitive polymer is 1 to 50 weight % with respect to the total chemically amplified photoresist composition. If the amount of the photosensitive polymer is less than 0.1 weight %, it is difficult to form a pattern having desired thickness because the resist film formed by the coating is very thin, and if the amount of the photosensitive polymer is more than 50 weight %, the coating uniformity thereof can be lowered.

The photo-acid generator generates a photo-acid component, such as H$^+$, by the exposure, which induces a chemical amplification. Conventional photo-acid generators can be widely used in the present invention. As the acid producing agent, sulfonium salt, an onium salt such as iodonium, N-iminosulfonate, disulfone such as

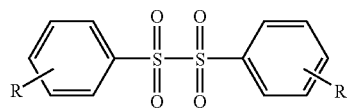

(wherein R is —H, —CH$_3$, or —C(CH$_3$)$_3$), bisarylsulfonyidiazomethane, such as

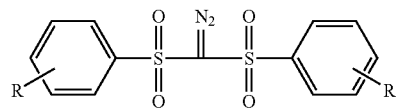

(wherein R is —H, —CH$_3$, or —C(CH$_3$)$_3$), arylcarbonylarylsulfonyldiazomethane, such as

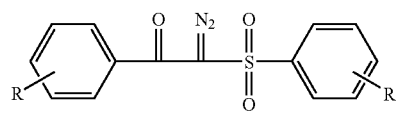

(wherein R is —H, —CH$_3$, or —C(CH$_3$)$_3$), or the mixtures thereof can be used. Examples of the sulfonium salt include the following compounds but are not limited to them.

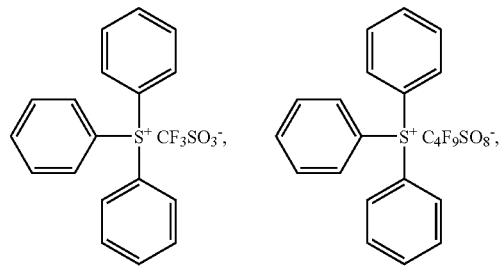
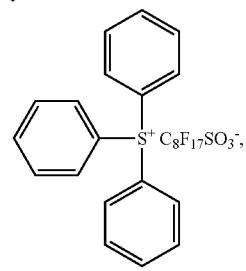

-continued
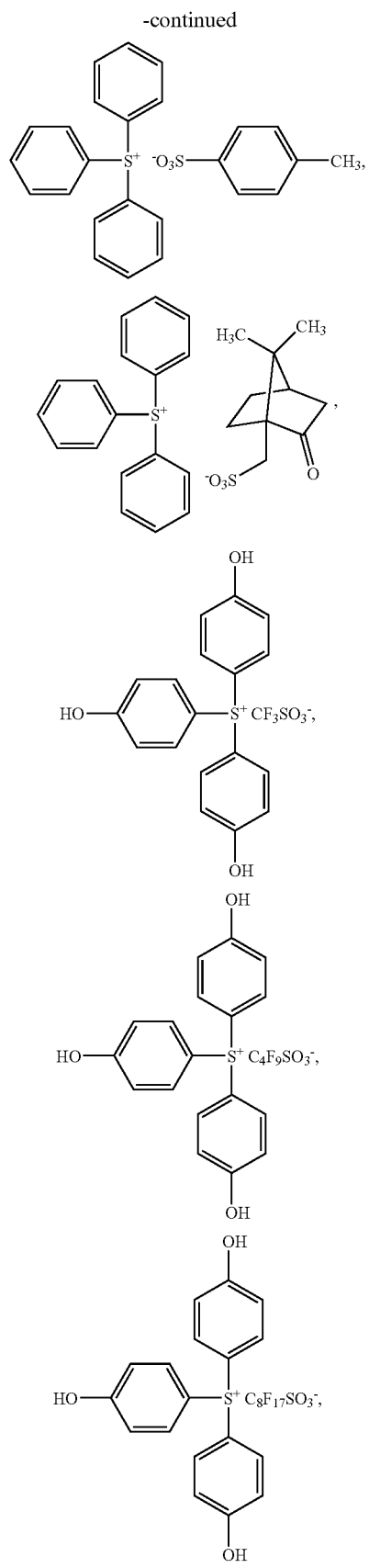
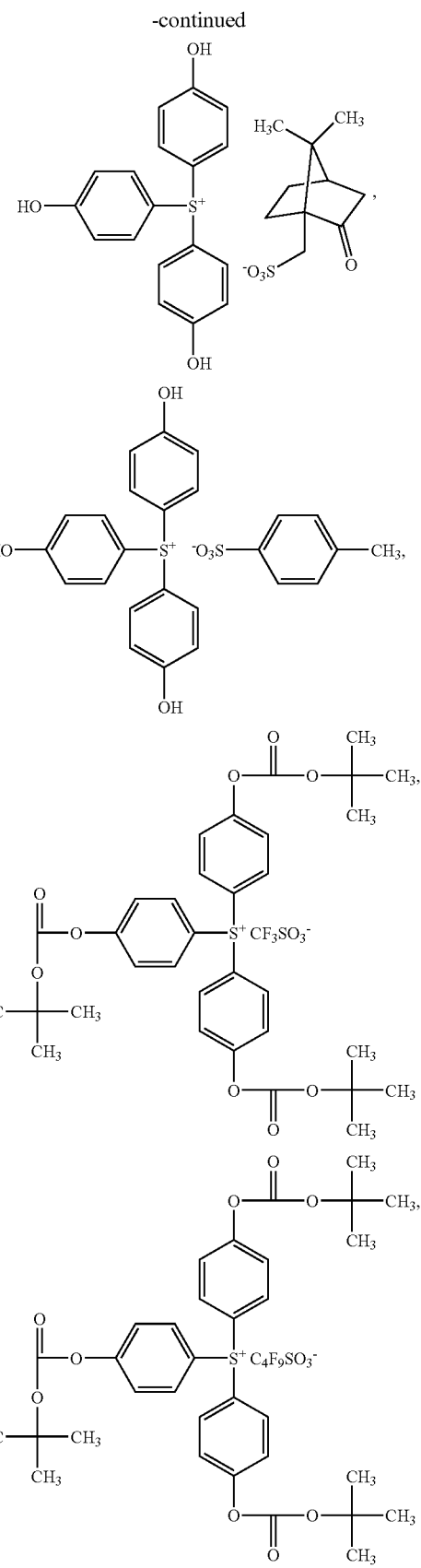

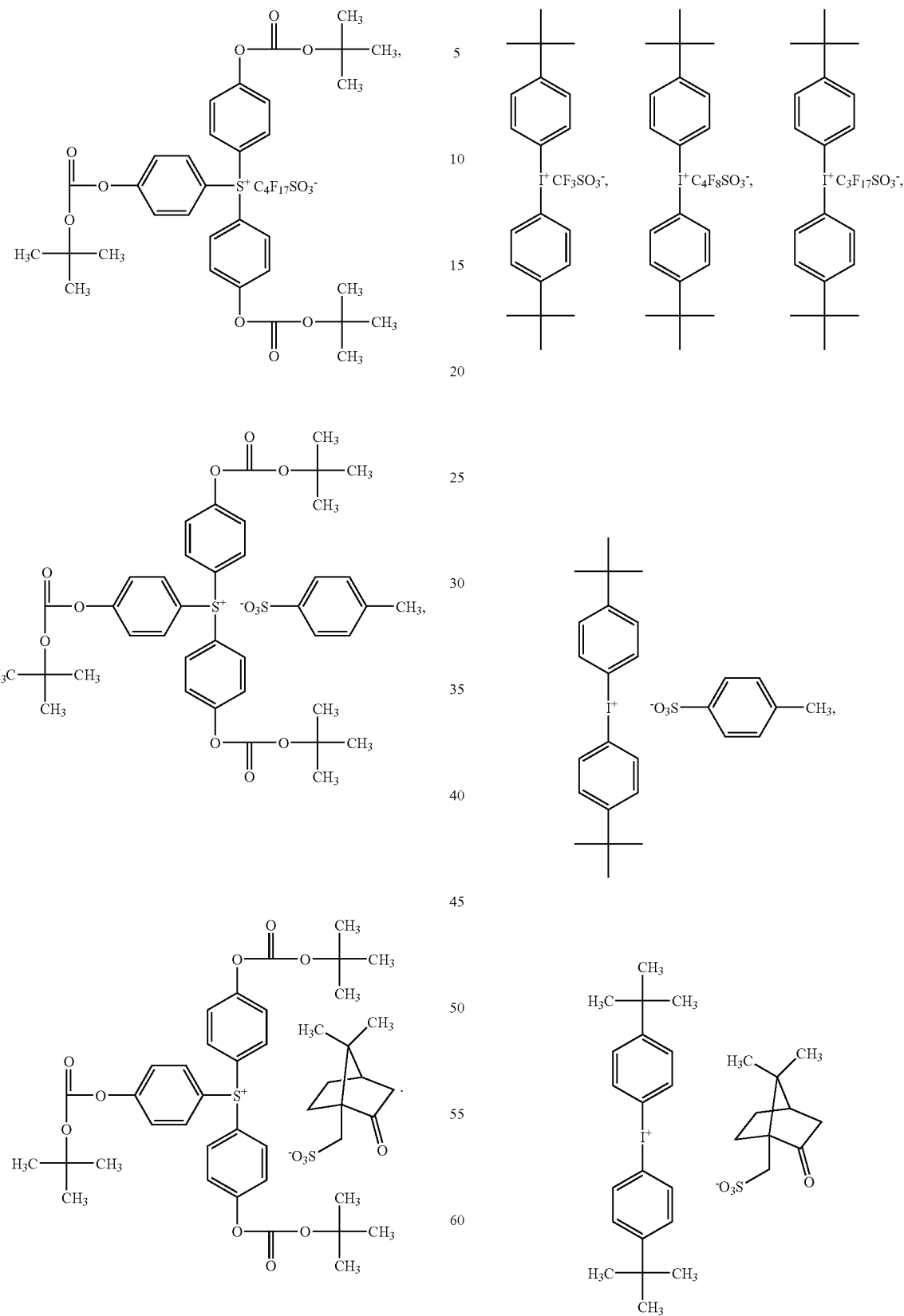
Examples of the onium salt include the following compounds but are not limited to them.

Exemplary N-iminosulfonate includes the compounds of

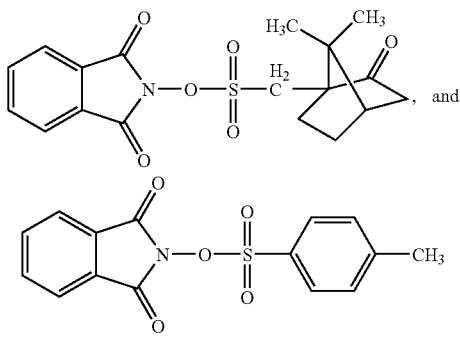

Preferably, the amount of the photo-acid generator is 0.1 to 50 weight % with respect to the total chemically amplified photoresist composition, and more preferably the amount of the photo-acid generator is 0.1 to 30 weight %. If the amount of the photo-acid generator is less than 0.1 weight %, it is difficult to deprotect the blocking group because the amount of the acid component generated by the exposure is little, and if the amount of the photo-acid generator is more than 50 weight %, the absorbance of the resist increases to cause the slope of the patterns.

As the organic solvent for the photoresist composition of the present invention, various organic solvent useful in conventional photoresist composition can be used. Exemplary organic solvent includes ethyl lactate, ethyleneglycol monoethyletheracetate, propyleneglycol monomethyletheracetate, ethyletheracetate, n-butyl acetate, methylisobutylketone, ethyl-3-ethoxy propionate, 3-methoxy-methyl propionate, diglycolmonoethylether, 2-heptanone, diacetone alcohol, β-methoxyisobutylic acid methylester, propyleneglycol monomethylether, propyleneglycol monomethylpropionate, methyl lactate, butyl lactate, ethyl pyruvate, γ-butyrolactone and the mixtures thereof.

If necessary, the photoresist composition of the present invention may include a dissolution inhibitory agent besides the photosensitive polymer, the photo-acid generator and the organic solvent. The dissolution inhibitory agent decreases a solubility of the non-exposed part of the resist film so that the solubility difference between the non-exposed part and the exposed part is increased and the contrast is enhanced. The conventional dissolution inhibitory agent can be used for the photoresist composition of the present invention. Preferably, the amount of the dissolution inhibitory agent is 0.1 to 50 weight % with respect to the photosensitive polymer.

Photoresist pattern can be formed on a substrate using the chemically amplified photoresist composition of the present invention. First, the chemically amplified photoresist composition is spin coated on the substrate, such as silicon wafer or aluminium wafer, for example, with a spin coater to form a photoresist layer on the substrate. The photoresist layer is nearly not soluble even with the treatment of alkali aqueous solution because the solubility of photosensitive polymer therein is low. Then the photoresist layer is exposed to the light source of a short wavelength. The photo-acid generator in the photoresist composition reacts with the light to produce a photo-acid. The blocking group for inhibiting development, pendant from a main chain of the photosensitive polymer, is deprotected by the additional heating which induces a chemical amplification of the photo-generated acid. Accordingly, the solubility of exposed part for the developing solution is largely increased to generate the solubility difference between the exposed part and the non-exposed part. The chemically amplified photoresist composition of the present invention has a more excellent resolution in comparison with the conventional positive chemically amplified photoresist composition reacting with the G-line light and I-line light.

Hereinafter, preferable examples are provided for better understanding of the present invention. However, the present invention is not limited to the following examples.

EXAMPLE 1

Synthesis of poly(HS-co-DEES-co-Styrene-co-CBCPS)

(Formula 1a)

a) Synthesis of 4-Cyanomethylstyrene(CyMS)

As shown in the following Reaction 1a, 49.01 g of sodium cyanide (NaCN), 70.07 g of water and 50.96 g of ethanol were added into a 500 ml 4-neck flask equipped with a mechanical stir, and the temperature of the solution was elevated to 60° C. to completely dissolve NaCN. To the solution, 87.50 g of 4-chloromethylstyrene was slowly added and the reaction was carried out for 3 hours at the temperature of 60-70° C. After completion of the reaction, the solution was cooled to 40° C., 100 g of diethylether was added to the solution, and the diethylether layer was separated. The separated organic layer was extracted with 300 g of water three times. The water layer was extracted with 50 g of diethylether and the diethylether extract was added to the organic layer. The separated organic layer was dried with magnesium sulfate for one day, and then the organic solvent was removed using an evaporator to obtain 4-cyanomethylstyrene of deep purple color. The yield of the product was 80%.

[Reaction 1a]

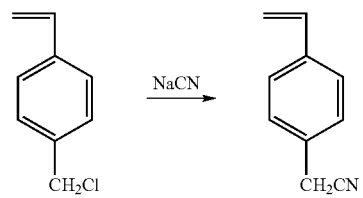

b) Synthesis of 4-(3-Cyano-di-1,5-t-butoxycarbonyl-pentyl)styrene (CBCPS)

As shown in the following Reaction 1b, 57.28 g of 4-cyanomethylstyrene prepared in the above process and 1.4 g of triton surfactant were added into a 500 ml 4-neck flask equipped with a mechanical stir, and then were dissolved with 40 g of dioxane. 102.54 g of t-butylacrylate were slowly added to the solution for about 30 minutes while maintaining the temperature of the reactor at 60° C., and the reaction was carried out for 24 hours while stirring. After completion of the reaction, the reactant was neutralized with hydrochloric acid solution, and the neutralized reactant was extracted with 100 g of diethylether and 300 g of water three times. The water layer was extracted with 50 g of diethylether, and the diethylether extract was added to the organic layer. The separated organic layer was dried with magnesium sulfate for one day, and then the organic solvent was removed using an evaporator. The obtained product was distilled under reduced pressure to remove unreacted materials, and recrystallized with methanol to obtain light yellow CBCPS in the yield of 60%.

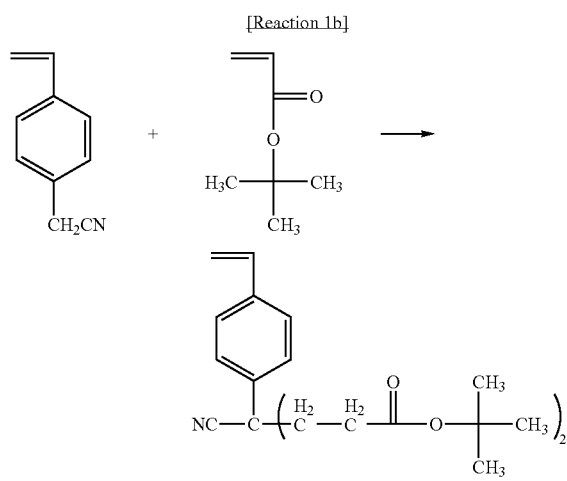

c) Synthesis of poly(HS-co-pEES-co-Styrene-co-CB-CPS)

As shown in the following Reaction 1c, 200 ml of tetrahydrofuran(THF) was introduced into a 500 ml 4-neck flask equipped with a temperature controlling apparatus and a nitrogen gas introducing apparatus, and was stirred for 30 minutes with introducing nitrogen. To the reactor, 42.17 g of 4-acetoxystyrene, 53.83 g of 4-(1-ethoxy)-ethoxystylene, 10.42 g of styrene, 15.98 g of CBCPS prepared in the above process, and 2.06 g of AIBN were added at 25° C. The temperature of the reactant was elevated to 40° C., and the reactant was stirred for 30 minutes under a nitrogen atmosphere. The temperature of the reactor was then elevated to 60-70° C. and the reactant was stirred for additional 24 hours under reflux. After completion of the reaction, the temperature of the reactant was lowered to room temperature (25° C.) and the reactant was poured into 2 l of hexane to obtain the precipitates. The obtained precipitates were filtered and washed with 2 l of hexane several times and were vacuum dried. The dried polymer was dissolved with 200 ml of methanol in a flask, and 12.00 ml of 28 weight % $NH_3$ aqueous solution was added thereto and the mixture was slowly stirred. After the polymer was completely dissolved, the mixture was stirred for additional 30 minutes. The stirred solution was poured into 2 l of water to obtain the precipitates. The precipitate were filtered and washed with 2 l of pure water several times and vacuum dried for 2 days to obtain 44.57 g of poly(HS-co-pEES-co-Styrene-co-CB-CPS).

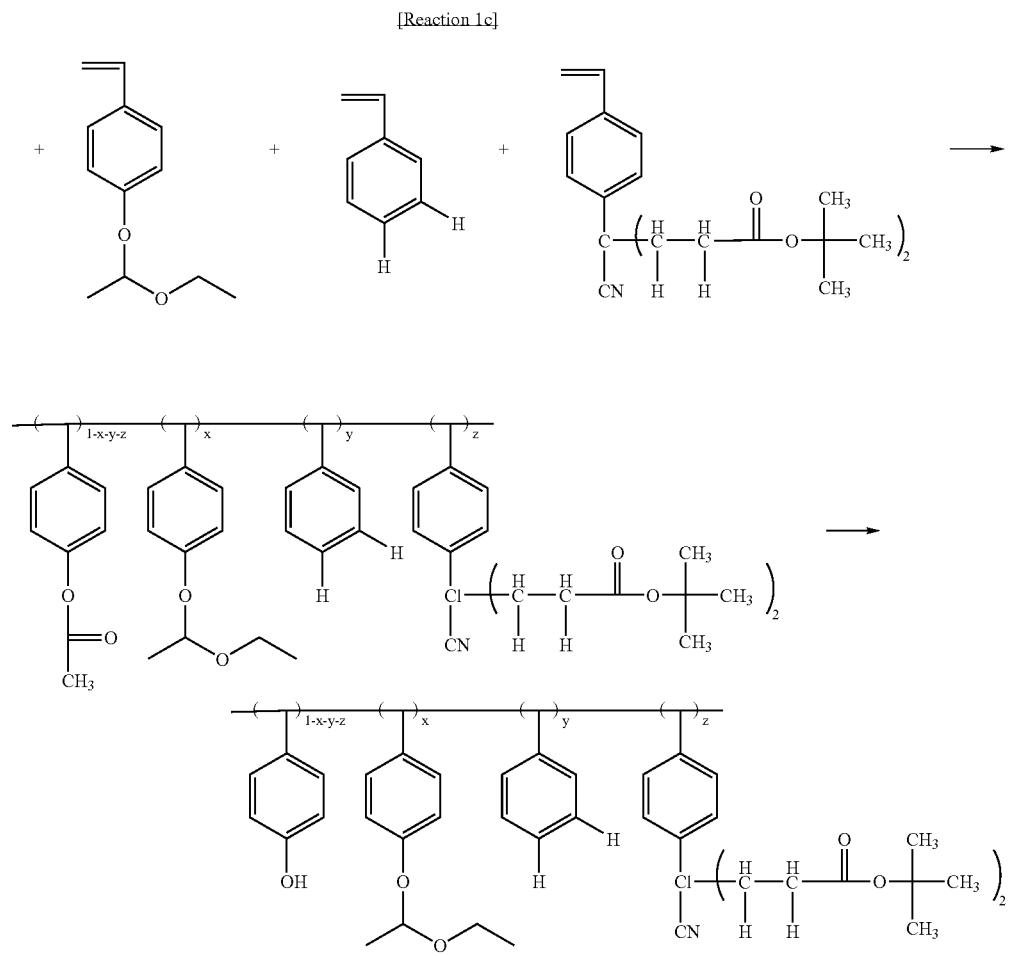

In Reaction 1c, 1-x-y-z, x, y and z are the same as defined in Formula 1.

EXAMPLE 2

Synthesis of poly(HS-co-pEES-co-pTBS-co-CBCPS)

(Formula 1b)

As shown in the following Reaction 2, except for using 17.63 g of para-tert-butoxy styrene instead of 10.42 g of styrene as the monomer, using 2.27 g of AIBN as the initiator and using 11.89 ml of 28 weight % NH$_3$ aqueous solution, the same method as described in Example 1 was carried out to obtain 47.73 g of poly(HS-co-pEES-co-pTBS-co-CBCPS) of Formula 1b.

As shown in the following Reaction 3a, 200 ml of tetrahydrofuran(THF) was introduced into a 500 ml 4-neck flask equipped with a refluxing cooler, a temperature controlling apparatus and a nitrogen gas introducing apparatus, and was stirred for 30 minutes with introducing nitrogen. To the reactor, 58.39 g of 4-acetoxystrene, 53.83 g of 4-(1-ethoxy)-ethoxystyrene, 15.98 g of CBCPS prepared in Example 1(b), and 2.23 g of AIBN as the initiator were added. The temperature of the reactor was elevated to 40° C. and the reactant was stirred for 30 minutes under a nitrogen atmosphere. The temperature of the reactor was then elevated to 60-70° C. and the reactant was stirred for 24 hours under reflux. After completion of the reaction, the temperature of the reactant was lowered to room temperature(25° C.) and the reactant was poured into 2 l of hexane to obtain the precipitates. The obtained precipitates were

[Reaction 2]

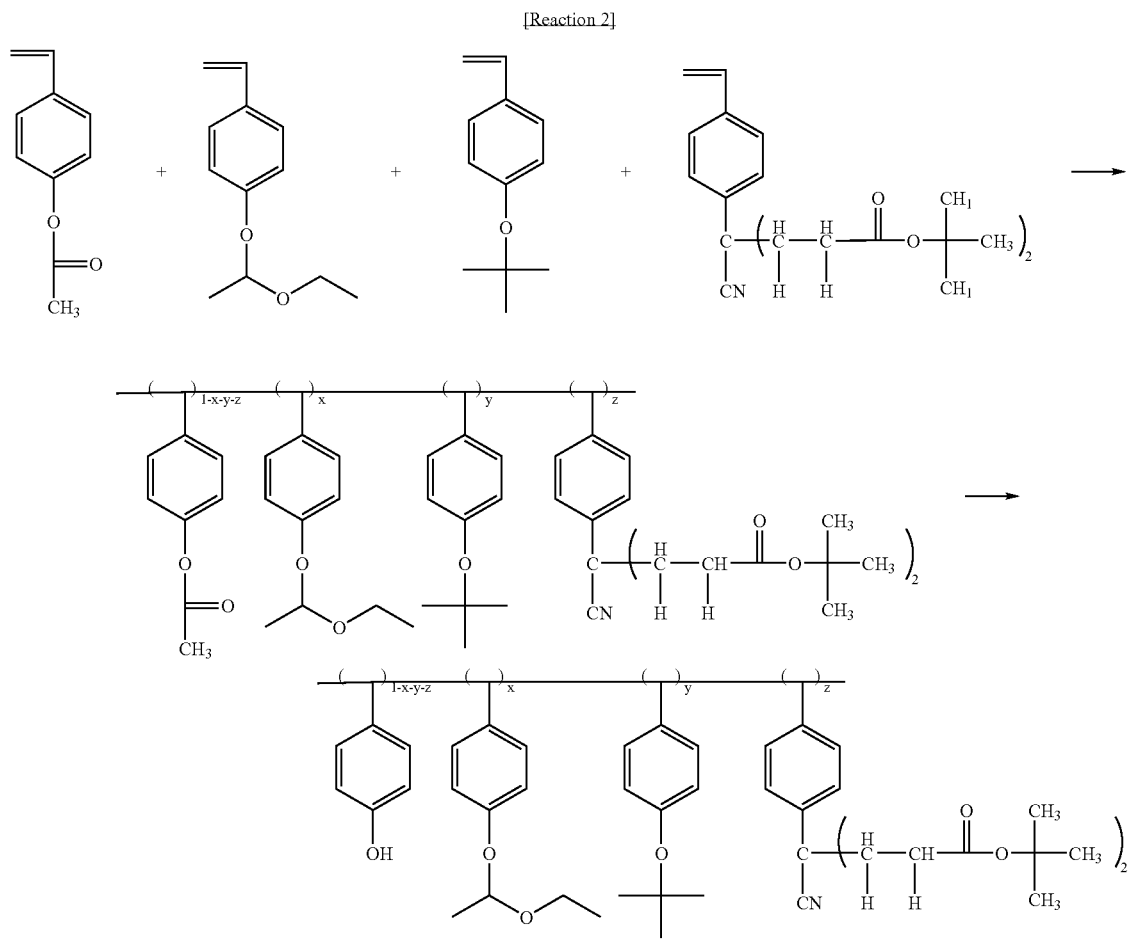

In Reaction 2,1-x-y-z, x, y and z are the same as defined in Formula 1.

EXAMPLE 3

Synthesis of poly(HS-co-DEES-co-tBocS-co-CBCPS)

(Formula 1c)

a) Synthesis of Poly(HS-co-pEES-co-CBCPS)

filtered and washed with 2.2 l of hexane several times and were vacuum dried. The dried polymer was dissolved with 200 ml of methanol in a flask, and 17.48 ml of 28 weight % NH$_3$ aqueous solution were added thereto and the mixture was slowly stirred. After the polymer was completely dissolved, the mixture was additionally stirred for 30 minutes. The solution was poured into 2 l of water to obtain the precipitates. The precipitate were filtered and washed with 2 l of pure water several times and vacuum dried for 2 days to obtain 55.77 g of poly(HS-co-pEES-co-CBCPS).

[Reaction 3a]

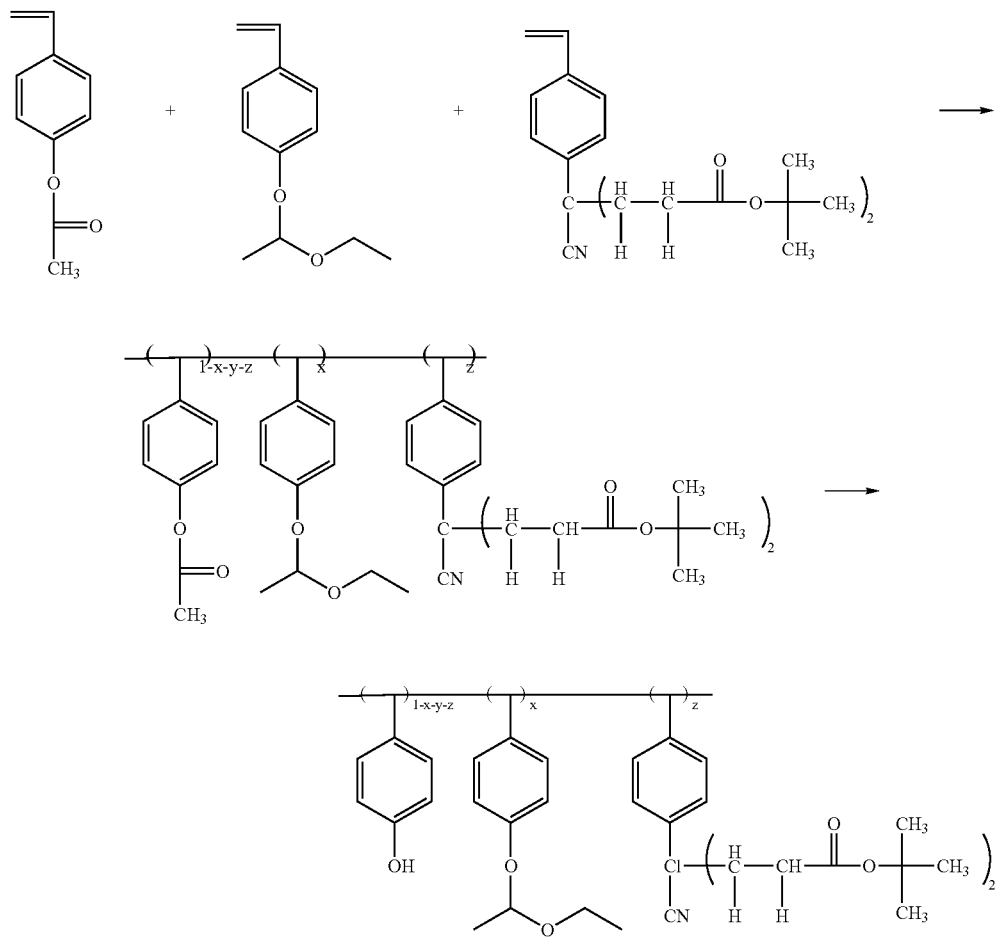

In Reaction 3a, 1-x-z, x and z are the same as defined in Formula 1.

b) Synthesis of poly(HS-co-PEES-co-tBocS-co-CBCPS)

As shown in the following Reaction 3b, 200 ml of THF was introduced into a 500 ml 1-neck flask, and 55.77 g of poly(HS-co-pEES-co-CBCPS), 23.57 g of di-tert-butyl-dicarbonate and 10.92 g of triethylamine were introduced into the 500 ml 1-neck flask. The reactant was stirred for 15 hours 25° C. After completion of the reaction, the reactant was poured into 2 l of water to obtain the precipitates. The obtained precipitates were filtered and washed with 2 l of water several times and were vacuum dried for 2 days, to obtain 66.24 g of poly(HS-co-pEES-co-tBocS-CBCPS).

[Reaction 3b]

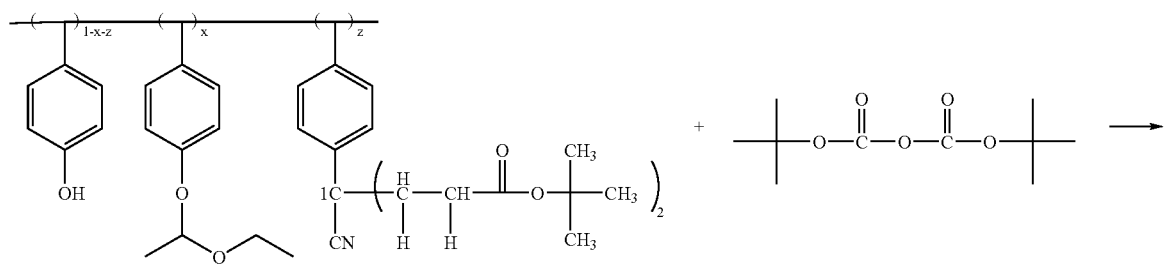

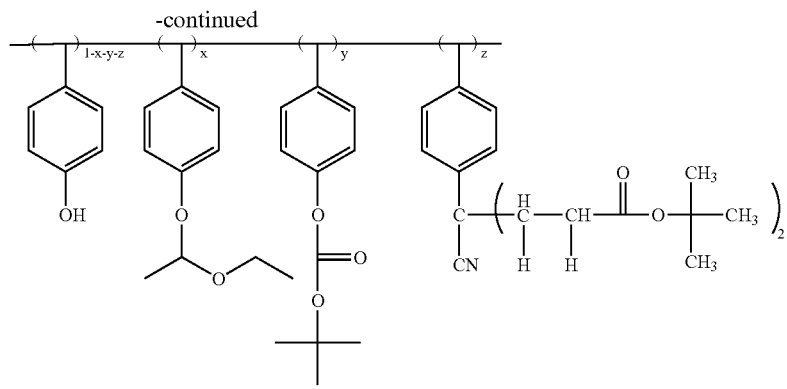

-continued

In Reaction 3b, 1-x-y-z, x, y and z are the same as defined in Formula 1.

EXAMPLE 4

Synthesis of poly(HS-co-pEES-co-tHPS-co-CBCPS)

(Formula 1d)

As shown in the following Reaction 4, except for using 21.83 g of tetrahydropyranyl oxystyrene instead of 10.42 g of styrene as the monomer, using 2.39 g of AIBN as the initiator and using 12.63 ml of 28 weight % $NH_3$ aqueous solution, the same method as described in Example 1 was carried out to obtain 55.98 g of poly(HS-co-pEES-co-tHPS-co-CBCPS) of Formula 1d.

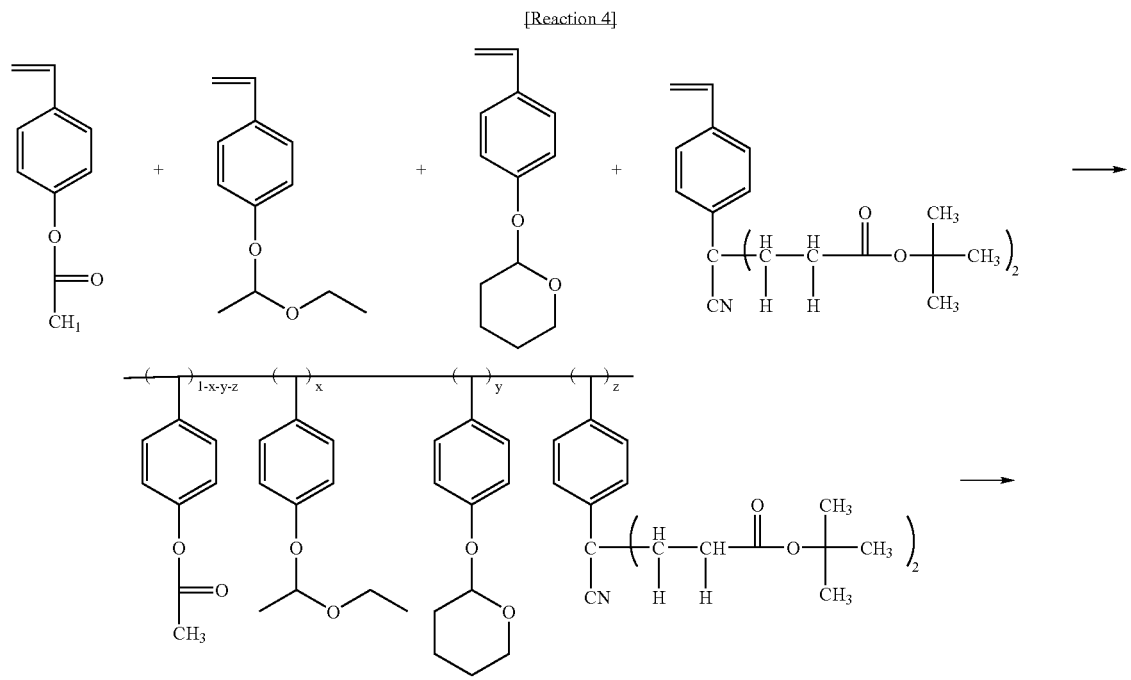

[Reaction 4]

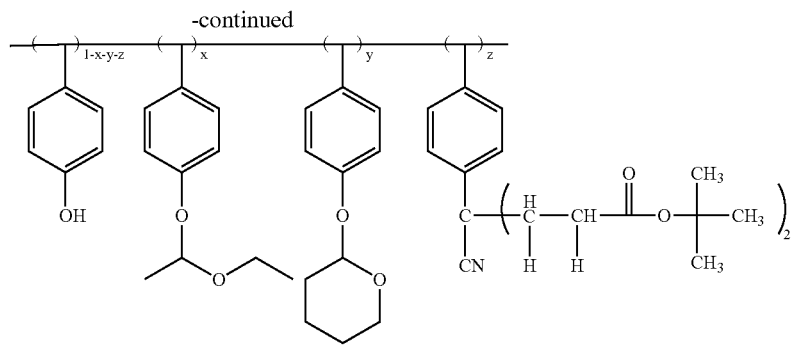

In Reaction 4, 1-x-y-z, x, y and z are the same as defined in Formula 1.

EXAMPLES 5-14

Preparation of the Chemically Amplified Photoresist Composition and Formation of Fine Pattern The chemically amplified photoresist compositions were obtained by dissolving the photosensitive polymer prepared in Examples 2-4 and the photo-acid generator of Formulas 2-5 into the ethyl lactate(EL, organic solvent) according to the weight ratios shown in Table 1. The obtained photoresist composition is spin coated on a silicon substrate by 3000 rpm and heated at 130° C. for 90 seconds to form a photoresist layer. A fine pattern photo-mask was mounted over the photoresist layer, and then the photoresist layer was exposed to a light of 248 nm wavelength. Thereafter the photoresist layer was baked at 130° C. for 90 seconds. The baked wafer was developed with 2.38 weight % tetramethyl ammoniumhydroxide (TMAH) aqueous solution for 60 seconds, and washed with pure water to form a fine pattern. The relative sensitivity and the resolution of the obtained fine circuit pattern were measured and are set forth in Table 1.

[Formula 2]

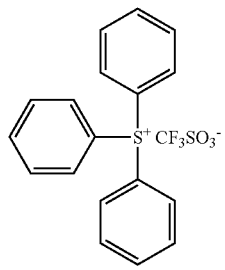

[Formula 3]

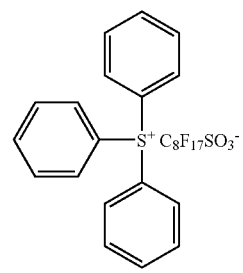

[Formula 4]

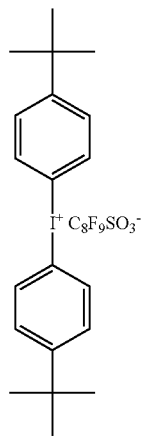

[Formula 5]

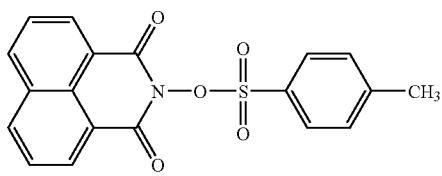

COMPARATIVE EXAMPLES 1 AND 2

Preparation of the Chemically Amplified Photoresist Composition and Formation of Fine Pattern The chemically amplified photoresist compositions was obtained by dissolving the photosensitive polymer of the following Formula 6 or 7 and the photo-acid generator of Formula 2 or 3 into ethyl lactate(EL, organic solvent) according to the weight ratios shown in Table 1. The semiconductor circuit patterns were formed by the same method as described in Example 5, using the obtained compositions. The relative sensitivity and the resolution of the obtained fine patterns were measured and are set forth in Table 1.

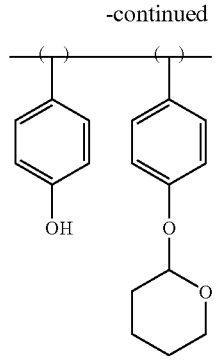

[Formula 7]

TABLE 1

| | Composition of photoresist | | | Physical property of pattern | | |
|---|---|---|---|---|---|---|
| | Polymer (weight part) | Photo-acid generator (weight part) | Solvent (weight part) | Thickness of thin layer (μm) | Relative sensitivity (mJ/cm$^2$) | Resolution (μm) |
| Example 5 | Formula 1b (100) | Formula 2 (5) | EL (550) | 0.38 | 22 | 0.10 |
| Example 6 | Formula 1b (100) | Formula 3 (5) | EL (550) | 0.40 | 24 | 0.10 |
| Example 7 | Formula 1b (100) | Formula 4 (5) | EL (550) | 0.40 | 18 | 0.13 |
| Example 8 | Formula 1b (100) | Formula 2 (3) Formula 5 (2) | EL (550) | 0.39 | 22 | 0.13 |
| Example 9 | Formula 1b (100) | Formula 3 (3) Formula 5 (2) | EL (550) | 0.41 | 30 | 0.13 |
| Example 10 | Formula 1c (100) | Formula 2 (5) | EL (550) | 0.40 | 20 | 0.13 |
| Example 11 | Formula 1c (100) | Formula 3 (5) | EL (550) | 0.40 | 22 | 0.18 |
| Example 12 | Formula 1c (100) | Formula 3 (3) Formula 5 (2) | EL (550) | 0.41 | 18 | 0.18 |
| Example 13 | Formula 1d (100) | Formula 2 (5) | EL (550) | 0.40 | 18 | 0.18 |
| Example 14 | Formula 1d (100) | Formula 3 (5) | EL (550) | 0.42 | 20 | 0.24 |
| Comparative Example 1 | Formula 6 (100) | Formula 2 (5) | EL (550) | 0.40 | 20 | 0.24 |
| Comparative Example 2 | Formula 7 (100) | Formula 3 (5) | EL (550) | 0.41 | 20 | 0.24 |

In Table 1, the relative sensibility means an optimal energy (Eop). As shown in Table 1, the chemically amplified photoresist compositions of the present invention prepared in Examples 5-14 have resolutions that are much excellent compared to those of the compositions prepared in the Comparative examples 1 and 2. Accordingly, the fine circuit patterns can be formed even with the exposure light source of 248 nm. As described above, the photosensitive polymer and the chemically amplified photoresist composition according to the present invention has a merit in that the footing phenomenon is not generated even if there is the PED between the exposure process and the PEB process. Also, the photosensitive polymer and the chemically amplified photoresist composition according to the present invention have an excellent resolution even when using the exposure light source of a short wavelength so that the fine circuit pattern can be formed.

While the present invention has been described in detail with reference to the preferred embodiments, those skilled in the art will appreciate that various modifications and sub-

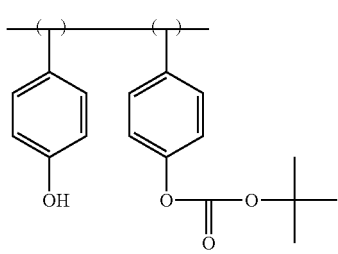

[Formula 6]

stitutions can be made thereto without departing from the spirit and scope of the present invention as set forth in the appended claims.

The invention claimed is:

1. A photosensitive polymer represented by the following Formula 1,

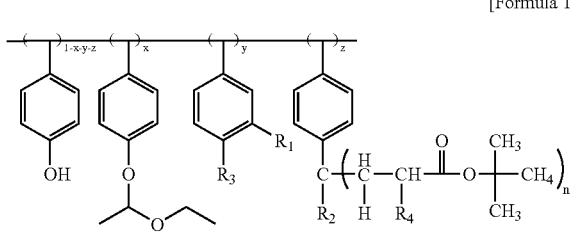

[Formula 1]

wherein $R_1$ is a hydrogen atom, $R_2$ is a hydrogen atom,

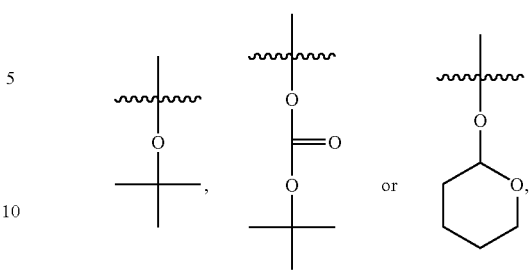

$R_3$ is a chlorine atom, a bromine atom, hydroxy, cyano, t-butoxy, $CH_2NH_2$, $CONH_2$, $CH=NH$, $CH(OH)NH_2$ or $C(OH)=NH$ group, $R_4$ is a hydrogen atom or methyl group, each of 1-x-y-z, x, y and z is a degree of polymerization of each repeating unit constituting the photosensitive polymer, x, y and z are 0.01 to 0.8, respectively, and n is 1 or 2.

2. The photosensitive polymer of claim 1, wherein the photosensitive polymer has the weight average molecular weight of 3,000 to 30,000 and the polydispersity of 1.01 to 3.00.

3. The photosensitive polymer of claim 1, wherein the photosensitive polymer is selected from the group consisting of the compounds of the following Formulas 1a to 1d,

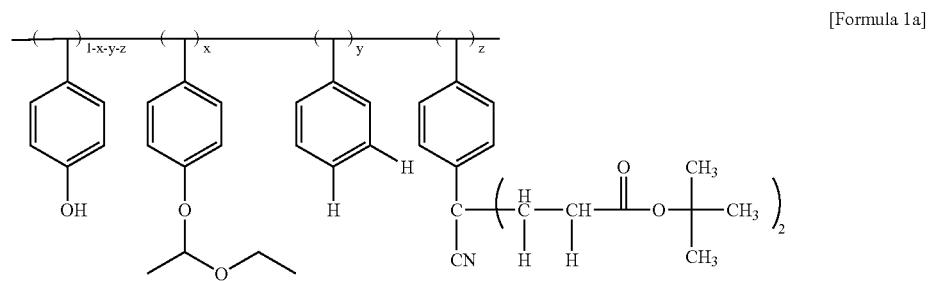

[Formula 1a]

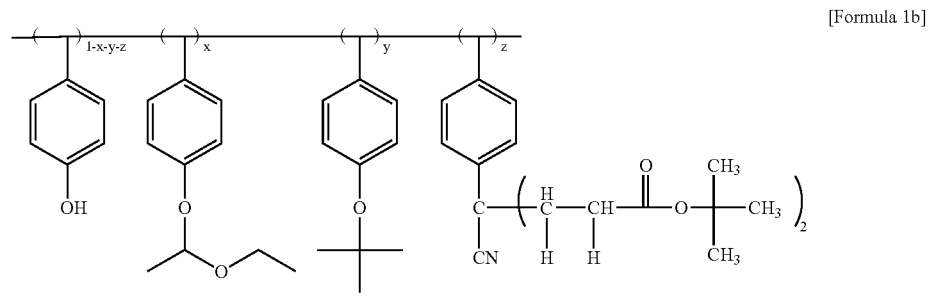

[Formula 1b]

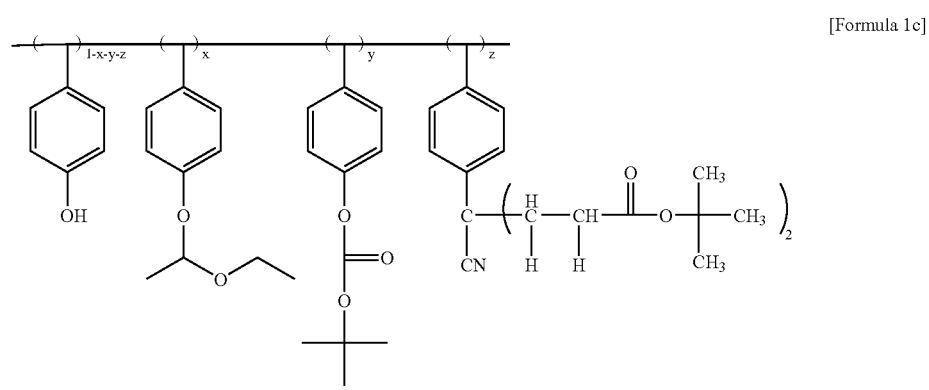

[Formula 1c]

-continued

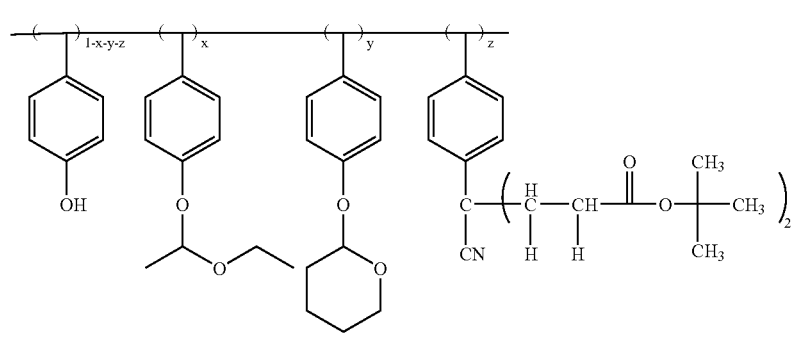
[Formula 1d]

wherein 1-x-y-z, x, y and z are a degree of polymerization of each repeating unit constituting the photosensitive polymer, and x, y and z are 0.01 to 0.8, respectively.

4. A chemically amplified photoresist composition comprising:
   a photosensitive polymer represented by the above Formula 1;
   a photo-acid generator for generating a photo-acid; and
   an organic solvent.

5. The chemically amplified photoresist composition of claim 4, wherein the amount of the photosensitive polymer of Formula 1 is 0.1 to 50 weight % with respect to the total chemically amplified photoresist composition.

6. The chemically amplified photoresist composition of claim 4, wherein the photo-acid generator is selected from the group consisting of:

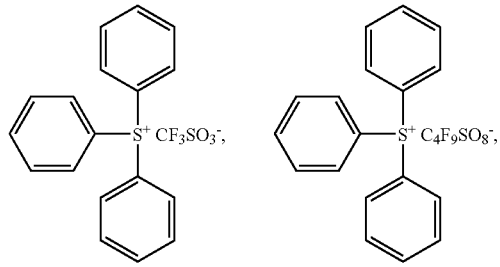

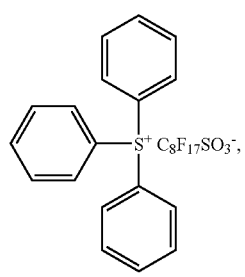

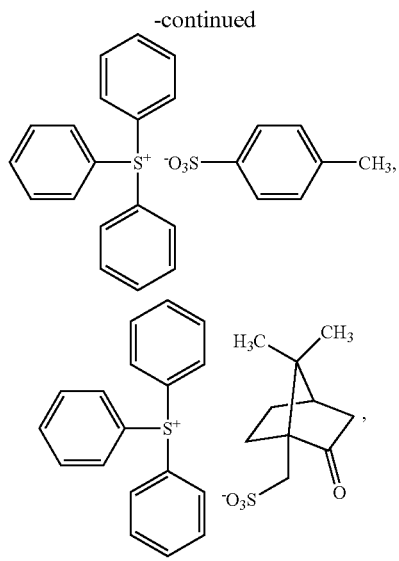

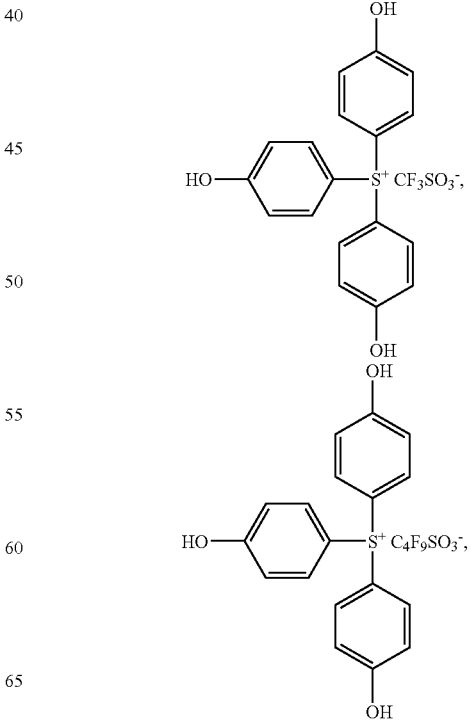

-continued
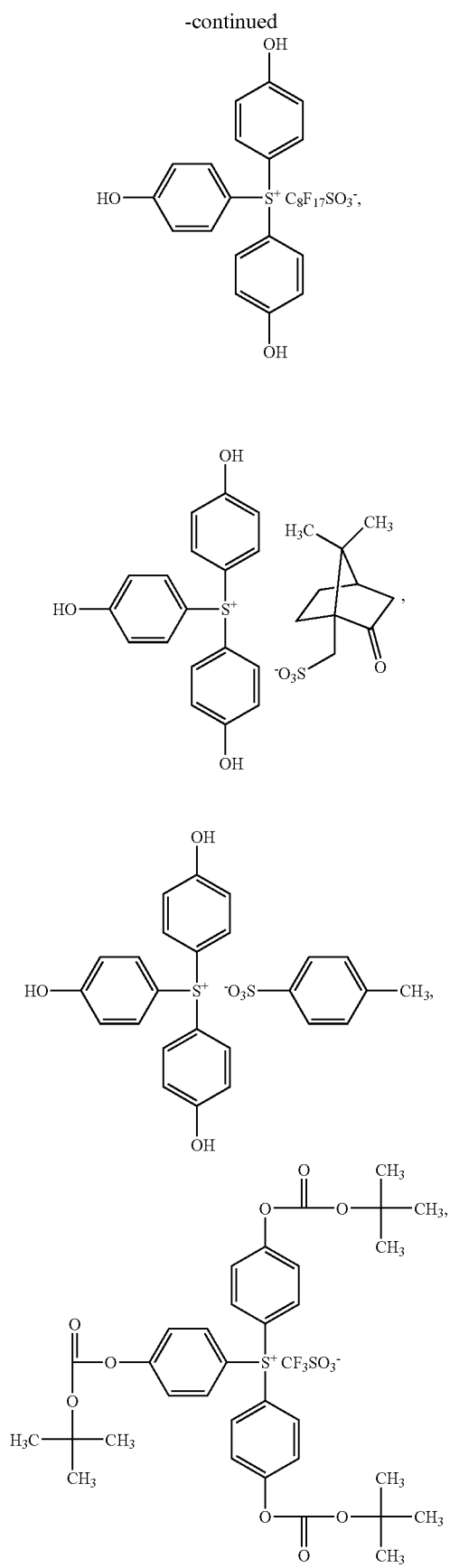
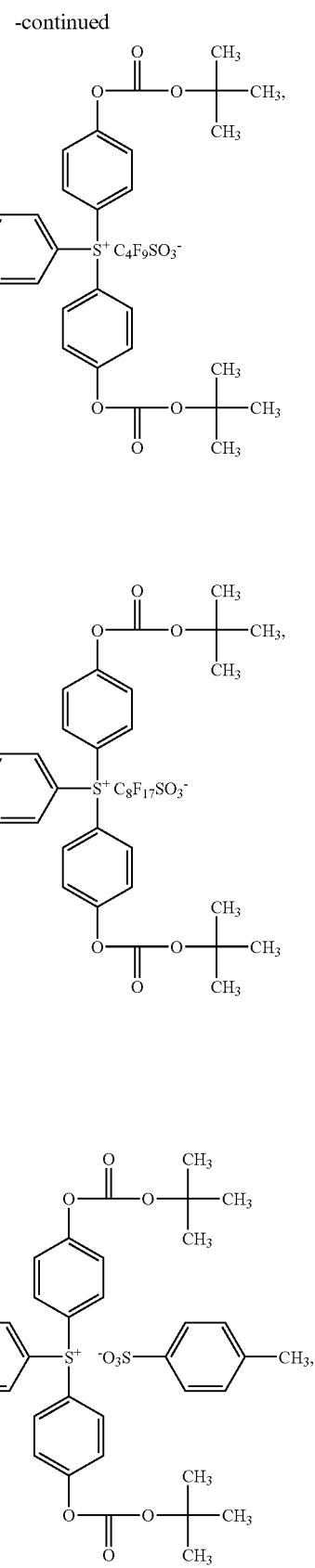

-continued

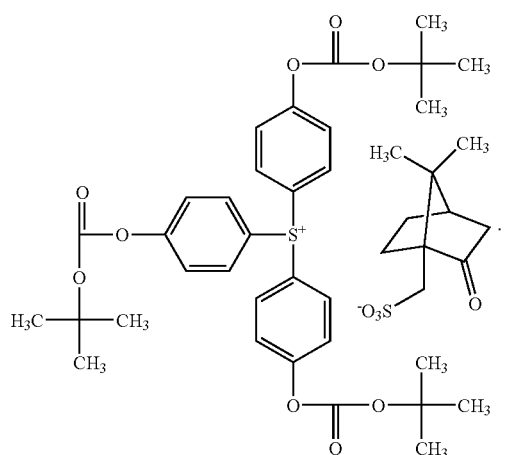

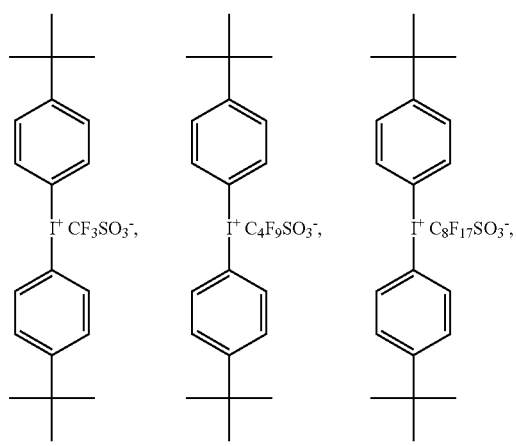

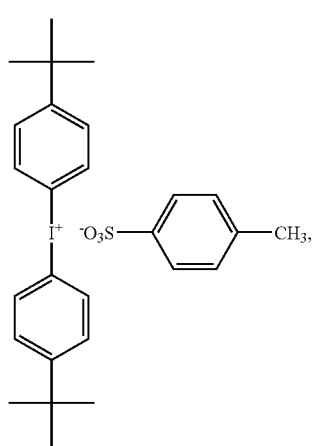

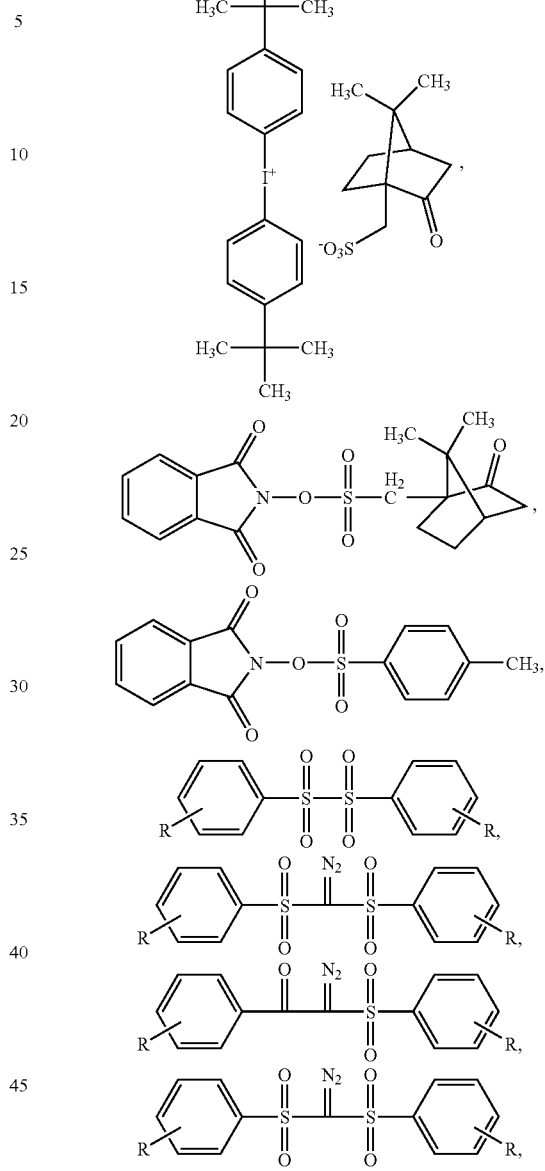

(wherein R is —H, —CH$_3$, or —C(CH$_3$)$_3$), and mixtures thereof, and the amount of the photo-acid generator is 0.1 to 50 weight % with respect to the total chemically amplified photoresist composition.

7. The chemically amplified photoresist composition of claim 4, wherein the organic solvent is selected from the group consisting of ethyl lactate, ethyleneglycol monoethyletheracetate, propyleneglycol monomethyletheracetate, ethyletheracetate, n-butyl acetate, methylisobutylketone, ethyl-3-ethoxy propionate, 3-methoxy-methyl propionate, diglycolmonoethylether, 2-heptanone, diacetone alcohol, β-methoxyisobutylic acid methylester, propyleneglycol monomethylether, propyleneglycol monomethylpropionate, methyl lactate, butyl lactate, ethyl pyruvate, γ-butyrolactone, and the mixtures thereof.

* * * * *